United States Patent
Schneider et al.

(10) Patent No.: US 8,250,905 B2
(45) Date of Patent: Aug. 28, 2012

(54) DEVICE FOR PROCESSING A KNOCK SENSOR SIGNAL

(75) Inventors: Klaus-Dieter Schneider, Lappersdorf (DE); Gerhard Wirrer, Kallmünz (DE)

(73) Assignee: Continental Automotive GmbH, Hannover (DE)

( * ) Notice: Subject to any disclaimer, the term of this patent is extended or adjusted under 35 U.S.C. 154(b) by 179 days.

(21) Appl. No.: 12/918,423

(22) PCT Filed: Feb. 26, 2009

(86) PCT No.: PCT/EP2009/052257
§ 371 (c)(1),
(2), (4) Date: Aug. 19, 2010

(87) PCT Pub. No.: WO2009/106557
PCT Pub. Date: Sep. 3, 2009

(65) Prior Publication Data
US 2010/0326170 A1 Dec. 30, 2010

(30) Foreign Application Priority Data
Feb. 28, 2008 (DE) .......... 10 2008 011 614

(51) Int. Cl.
*G01L 23/22* (2006.01)
(52) U.S. Cl. ........................ 73/35.01
(58) Field of Classification Search ............ 73/35.01, 73/35.07
See application file for complete search history.

(56) References Cited

U.S. PATENT DOCUMENTS

| | | | |
|---|---|---|---|
| 6,470,365 B1 * | 10/2002 | Rahman et al. ........... | 708/313 |
| 6,529,817 B2 * | 3/2003 | Torno et al. ............. | 701/111 |
| 7,181,339 B2 | 2/2007 | Remelman ............... | 701/111 |
| 7,254,475 B1 | 8/2007 | Grai et al. .............. | 701/111 |
| 7,295,916 B2 | 11/2007 | Sauler et al. ............ | 701/111 |
| 7,324,025 B1 | 1/2008 | Ding et al. .............. | 341/61 |
| 7,533,559 B2 | 5/2009 | Goto ..................... | 73/35.09 |
| 7,594,423 B2 * | 9/2009 | Padhi et al. ............. | 73/35.09 |
| 2005/0160124 A1 | 7/2005 | Bisiaux .................. | 708/300 |
| 2005/0190831 A1 | 9/2005 | Fukushima .............. | 375/232 |
| 2006/0206254 A1 | 9/2006 | Remelman ............... | 701/111 |
| 2007/0000306 A1 | 1/2007 | Danet et al. ............. | 73/35.04 |
| 2007/0214869 A1 * | 9/2007 | Kaneko et al. ........... | 73/35.09 |

FOREIGN PATENT DOCUMENTS

| | | |
|---|---|---|
| DE | 1004166 A1 | 8/2001 |
| DE | 10300204 A1 | 7/2004 |
| DE | 102005009370 A1 | 10/2005 |
| DE | 102005057987 | 7/2006 |
| EP | 1513254 | 3/2005 |

OTHER PUBLICATIONS

International Search Report and Written Opinion for Application No. PCT/EP2009/052257 (14 pages) Jun. 5, 2009.
German Office Action, German Patent Application No. 102008011614.9-52, 2 pages, Dec. 22, 2008.
International PCT Preliminary Report on Patentability, PCT/EP2009/052257, 10 pages, Feb. 26, 2009.

* cited by examiner

*Primary Examiner* — Freddie Kirkland, III
(74) *Attorney, Agent, or Firm* — King & Spalding L.L.P.

(57) ABSTRACT

For the processing of a knock sensor signal during the detection of knocking in a combustion engine, in order to allow for inexpensively designed, efficient, and accurate bandpass filtering, a signal processing device (10) has an analog filter (20), a sigma-delta modulator (30) designed for analog-digital conversion, a CIC filter (40) designed to decimate the sampling rate, and a digital filter (50).

20 Claims, 1 Drawing Sheet

DEVICE FOR PROCESSING A KNOCK SENSOR SIGNAL

CROSS-REFERENCE TO RELATED APPLICATIONS

This application is a U.S. National Stage Application of International Application No. PCT/EP2009/052257 filed Feb. 26, 2009, which designates the United States of America, and claims priority to German Application No. 10 2008 011 614.9 filed Feb. 28, 2008, the contents of which are hereby incorporated by reference in their entirety.

TECHNICAL FIELD

The invention relates to the processing of a knock sensor signal during the detection of knocking in an internal combustion engine, and in particular to a device for the realization of such signal processing.

BACKGROUND

The detection of knocking in an internal combustion engine is described, for example, in DE 103 00 204 AI. Abnormal combustion processes, described as "knocking", occurring in combustion chambers of internal combustion engines (in particular, for example, as a result of spontaneous unintended self-ignition of a combustible mixture) are detected by means of one or more knock sensors in accordance with the prior art. As knocking only makes itself known in one or more specific frequency ranges, bandpass filtering of the knock sensor signal is necessary. In the detection of knocking known from DE 103 00 20 204 A1, a filter which is not described in more detail with regard to structure and function is provided with bandpass characteristics for this purpose.

For reliable detection or distinction of knocking, whether combustion occurs with knocking or not, the quality of bandpass filtering during the processing of the knock sensor signal is of great importance.

U.S. Pat. No. 7,181,339 B2 discloses a device for real-time spectrum analysis of a knock signal in an internal combustion engine in which for signal processing an analog filter, a sigma-delta modulator designed for analog-digital conversion, and a CIC filter designed to decimate the sampling rate, are arranged in tandem. However, this only enables analysis of the knock signal but not use in an engine control device yet.

DE 100 04 166 A1 discloses a device for the detection of knocking in an internal combustion engine with at least one knock sensor assigned to a cylinder of the internal combustion engine, in which the actual detection of knocking takes place using purely digital components, the components typical of knocking being extracted from the edited and digitized output signals of the knock sensor or the knock sensors and for knock detection compared with definable thresholds which can be changed if necessary. Digital signal evaluation or the digital component is exemplary for three different embodiments. On the one hand, the digital component may comprise a filter, a rectifier and an integrator or it may comprise a means of performing a discrete Fourier transformation or a means of performing a rapid Fourier transformation.

SUMMARY

According to various embodiments, efficient, accurate bandpass filtering can be enabled during the processing of a knock sensor signal.

According to an embodiment, a device for the processing of a knock sensor signal during the detection of knocking in an internal combustion engine, may comprise the following signal processing components arranged in this order: an analog filter, a sigma-delta modulator designed for analog-digital conversion, a CIC filter designed to decimate the sampling rate, wherein downstream of the CIC filter is a digital filter with bandpass characteristics, and the CIC filter has n integrator levels and n+1 COMB levels, n being a natural number.

According to a further embodiment, the analog filter may have a low-pass characteristic. According to a further embodiment, the sigma-delta modulator can be implemented in wired-logic hardware, in particular as a micro-electronically integrated circuit arrangement. According to a further embodiment, the digital filter can be implemented by a program-controlled microcontroller. According to a further embodiment, the CIC filter can be designed to provide its output signal with a sampling rate which corresponds to 4 times the center frequency of the following digital filter. According to a further embodiment, the CIC filter may have an array of decimators and downstream COMB levels in order to provide multiple filtered output signals with different characteristics from each other.

BRIEF DESCRIPTION OF THE DRAWINGS

Hereinafter the invention is described in more detail on the basis of exemplary embodiments with reference to the attached drawings. These are.

DETAILED DESCRIPTION

Figure 1:
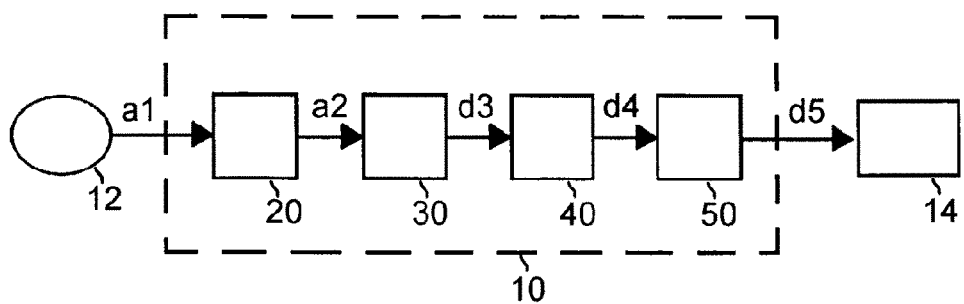
FIG. 1 a block diagram of a device for the detection of knocking using a device for processing a knock sensor signal, FIG. 2 a block diagram of a sigma-delta modulator suitable for signal processing shown in FIG. 1, and FIG. 3 a block diagram of a CIC filter suitable for signal processing shown in FIG. 1.

The device according to various embodiments for processing a knock sensor signal comprises the following signal processing components arranged in this order:
  an analog filter,
  a sigma-delta modulator designed for analog-digital conversion,
  a CIC filter designed to decimate the sampling rate,
  a digital filter with bandpass characteristics downstream of the CIC filter (40), wherein
  the CIC filter has n integrator levels and n+1 COMB levels, n being a natural number.

In this way inexpensive signal processing is enabled, in which one or more characteristic frequencies can be accurately filtered out of the knock sensor signal. The signal components or signal values thus obtained in the frequency bands concerned can then be compared to reference values or models in order to perform the actual detection of knocking.

Usually a CIC filter has n integrator levels and n COMB levels, n denoting a natural number. According to various embodiments, however, n integrator levels and n+1 COMB levels are provided. In this way a stronger performance of the CIC filter in the direction of the bandpass can be obtained.

The analog filter may, for example, be assembled by means of operational amplifiers or special application-specific integrated circuits ("ASIC"). However, it must be noted that an advantage of the various embodiments is precisely that within the framework of the various embodiments no overly great demands are made on the performance of the analog filter so that this in particular can also be designed comparatively simply and therefore inexpensively (e.g. as a passive filter).

Although a bandpass characteristic can be provided for the analog filter, according to an embodiment the analog filter has a low-pass characteristic.

With regard to a simple and inexpensive embodiment, the analog filter can be realized as a lower order filter, in particular a first-order filter. In one embodiment, for example, a first-order passive RC low-pass is provided.

Within the framework of the various embodiments the analog filter, in particular, has the function of an anti-aliasing filter for the following analog-digital conversion by means of the sigma-delta modulator.

The sigma-delta modulator is preferably implemented in wired-logic hardware, in particular, for example, as microelectronic integrated circuitry (e.g. in CMOS technology, e.g. as a special function block in the integrated circuit of a microcontroller in the engine control device).

Such modulators can also be realized very simply and inexpensively for relatively high sampling frequencies. Advantageously recourse can be had to circuit designs known per se for the implementation of the sigma-delta modulator.

The CIC ("cascaded integrator comb") filter is one such time- and value-discrete digital filter for conversion between various sampling rates known from the field of digital signal processing.

The CIC filter can be advantageously implemented in digital hardware, for example, by programmable integrated circuits (FPGA) and in the case of the application of interest here comprises a decimation filter consisting of a series of integration levels on the input side, followed by an actual sampling rate converter ("decimator"), which in turn is followed on the output side by a series of differentiation levels (so-called COMB levels). In an embodiment the CIC filter is implemented in "wired-logic" digital hardware, e.g. as ASIC, or as a special function block in the integrated circuit of a microcontroller in the engine control device.

In one embodiment it is envisaged that the CIC filter has an adjustable decimation rate. This is advantageous in particular if the filter characteristic of the signal processing device is to be adjusted to the respective internal combustion engine concerned. Thus, for example, one and the same filter implementation can in practice be employed for various types of engine (with adjusted filter setting). Alternatively or in addition, it may be envisaged that the filter characteristic should be varied depending on the operating status of the internal combustion engine concerned. In this case too, adjustability of components of the device, in particular, adjustability of the decimation rate of the CIC filter, is advantageous.

In an embodiment it is envisaged that the digital filter is implemented by a program-controlled microcontroller. When using the device or the method according to various embodiments within the framework of the detection of knocking in an internal combustion engine of a motor vehicle, digital filtering can, for example, be advantageously performed by a microcontroller which is anyway provided in such an engine control device for program-controlled realization of control tasks in the internal combustion engine concerned (e.g. gasoline engine or diesel engine). In this way the digital filter can be realized as it were without additional costs. As a result of the CIC filter upstream in the signal processing path, which reduces the sampling rate of the digital signal, the digital filter (preferably with bandpass characteristics) can be designed with lower transconductance and thus a lower order, which with the aforementioned use of a microcontroller advantageously saves processing time and memory.

Although it should not be ruled out that the upstream CIC filter is in its own hardware separate from the actual microcontroller of the engine control device (e.g. as ASIC, FPGA, etc.), or is also realized by software in the microcontroller, the CIC filter is preferably integrated into the actual microcontroller of the engine control device (e.g. distinguished as an on-chip peripheral block).

According to a development it is envisaged that the CIC filter is designed to provide its output signal with a sampling rate corresponding to 4 times the center frequency of the next digital filter. As a result the digital filter can be realized as a half-band filter, which significantly reduces the processing or storage time of a program-controlled realization of the digital filter.

In general it is advantageous if the filter characteristics of the signal processing device can be set depending on the requirements of the respective application (e.g. concrete design of the internal combustion engine). In particular, for example, a bandpass characteristic with a center frequency can be provided which can be set as a configuration parameter.

In an embodiment it is envisaged that the CIC filter has an array of decimators and downstream COMB levels, in order to provide several filtered output signals with different characteristics from each other. It is then easily possible to realize several bandpasses with a different center frequency based on the same input signal. The integrator levels of the CIC filter must only be provided once for each sensor signal to be processed. In such a multiple CIC filter adjustability of the individual decimation rates or adjustability of the individual output sampling frequencies can be provided in accordance with an advantageous development (e.g. in order to simplify subsequent digital filtering with variable center frequencies).

A use of the various embodiments is in the area of the detection of knocking in the combustion engine of a motor vehicle. The signal processing device according to the various embodiments can be structurally combined advantageously with components of an engine control device, wherein a program-controlled microcontroller provided for control tasks in the relevant internal combustion engine in the control device preferably performs the function of digital filtering.

FIG. 1 shows a device 10 for the processing of a knock sensor signal a1 during the detection of knocking in the internal combustion engine of a motor vehicle.

By means of a knock sensor 12, which, for example, is designed as an accelerometer and is fastened to the engine block, the sensor signal a1 representative of the vibrations of the internal combustion engine is recorded and supplied to the signal processing device 10.

The device 10 serves to filter one or more characteristic frequencies or frequency ranges out of the "knock signal" a1 and to provide a corresponding filtered signal d5 at an output of the device.

The actual detection of knocking, in other words assessment to that effect, of whether operation of the internal combustion engine takes place with or without knocking, is then ascertained by a evaluation device 14 based on the signal d5 supplied (in digital form). For this purpose, signal components in the relevant frequency ranges, for example, can be compared with reference values or models in the evaluation device in order to detect any knocking.

The device 10 comprises, arranged in sequence in a signal processing path:

an analog filter 20 with low-pass characteristics which supplies a low-pass filtered analog signal a2 based on the supplied analog sensor signal a1, a sigma-delta modulator 30 for conversion of the analog signal a2 into a digital signal d3, a CIC filter 40 (=cascading integrator-differentiator filter) which converts the signal d3 digitized with a particular sampling rate into a digital signal d4 of a reduced sampling rate, and a digital filter 50 with bandpass characteristics which, based on the digital signal d4 supplied, provides the bandpass-filtered signal d5, which is supplied to the evaluation device 14.

In the example shown of device 10, the analog filter 20 serves above all as an anti-aliasing filter for subsequent analog-digital conversion performed by the sigma-delta modulator 30. The CIC filter 40 serves to decimate the sampling rate of the digital signal so that the subsequent actual or particularly accurate bandpass filtering performed by the digital filter 50 requires advantageously reduced processing time.

The analog filter 20 is designed as a very simple and inexpensive first-order, passive RC-low-pass in the example shown.

Figure 2:
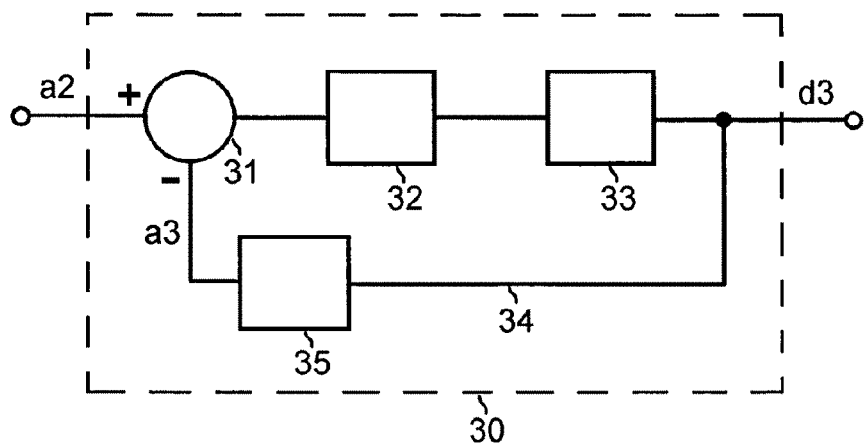

The sigma-delta modulator 30 is shown in more detail in FIG. 2.

In general, in a sigma-delta modulator the integrated ("sigma") difference ("delta") between an analog input signal and an analog representation of a quantized digital output signal is supplied to the quantizer (analog-digital converter stage). Through feedback the quantizer generates an output bit stream the value of which follows the analog input signal in terms of average time.

The sigma-delta modulator 30 comprises a summation node 31 to create the difference between the supplied analog signal a2 and a feedback signal a3. The analog difference signal created by the summation node 31 is supplied to an analog filter 32 with integration characteristics ("integrator"). The output signal of the integrator 32 is supplied to a 1-bit quantizer 33 operated with clock pulses which, as a result of time-discrete sampling, supplies the digital output signal d3 of the sigma-delta modulator 30. The signal d3 is supplied via a feedback path 34 to a 1-bit digital-analog converter 35, which supplies the signal a3.

The sigma-delta modulator 30 enables digitization with a comparatively high sampling rate at minimal cost. The CIC filter 40 is provided in order to simplify subsequent digital filtering.

Figure 3:
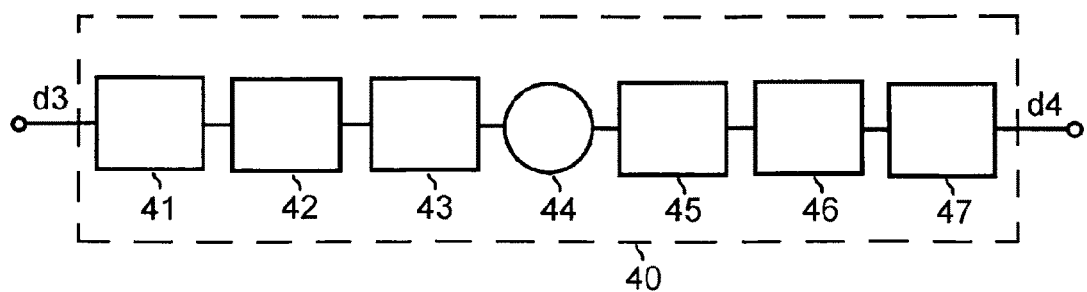

The CIC filter 40 is shown in more detail in FIG. 3 and comprises three integrator levels 41, 42 and 43 on the input side, a subsequent sampling rate converter or decimator 44, followed in turn by three differentiation or COMB levels 45, 46 and 47.

As a result of an adjustable decimation rate, the sampling rate of the signal d4 at the output of the CIC filter 40 can be adjusted in such a way that it corresponds to 4 times the center frequency of the desired bandpass. As a result, the subsequent digital filter 50 can be advantageously designed as a half-band filter. Digital half-band filters significantly reduce the processing time (as many coefficients are zero). In addition, a sampling rate at the output of the CIC filter 40 only amounting to 4 times the center frequency signifies an additional saving in terms of computing resources during digital filtering (compared with the filtering of signals with higher sampling rates).

The basic principle of signal processing performed by the device 10 is based on a combination of analog filtering, analog-digital conversion and subsequent digital filtering. Analog-digital conversion is realized by a sigma-delta modulator 30 which remains inexpensive even at very high sampling rates. The use of a high sampling frequency in the area of the sigma-delta modulator 30 substantially reduces requirements and therefore costs for the preceding analog filter 20. Because the digital signal d3 provided with a high sampling rate is not directly supplied for digital filtering but is first decimated by the CIC filter 40, the processing time for digital filtering can be vastly reduced. The digital filter 50 in the example shown can therefore be provided as a function of a microcontroller, which exists in any case, in the engine control device of the motor vehicle concerned. If need be, the aforementioned variation of the decimation rate can also be easily controlled at the decimator 44 by means of this microcontroller.

What is claimed is:

1. A device for the processing of a knock sensor signal during the detection of knocking in an internal combustion engine, comprising the following signal processing components arranged in this order:
    an analog filter,
    a sigma-delta modulator designed for analog-digital conversion,
    a CIC filter designed to decimate the sampling rate,
    wherein
    downstream of the CIC filter a digital filter with bandpass characteristics is arranged, and
    the CIC filter has n integrator levels and n+1 COMB levels, n being a natural number.

2. The device according to claim 1, wherein the analog filter has a low-pass characteristic.

3. The device according to claim 1, wherein the sigma-delta modulator is implemented in wired logic hardware.

4. The device according to claim 1, wherein the digital filter is implemented by a program-controlled microcontroller.

5. The device according to claim 1, wherein the CIC filter is designed to provide its output signal with a sampling rate which corresponds to 4 times the center frequency of the following digital filter.

6. The device according to claim 1, wherein the CIC filter has an array of decimators and downstream COMB levels in order to provide multiple filtered output signals with different characteristics from each other.

7. The device according to claim 1, wherein the sigma-delta modulator is implemented as a micro-electronically integrated circuit arrangement.

8. A method for processing of a knock sensor signal during the detection of knocking in an internal combustion engine, comprising:
    an analog filtering a sensor signal,
    converting said analog filtered signal by a sigma-delta modulator into a digital signal,
    decimate the sampling rate of said digital signal by a CIC filter having n integrator levels and n+1 COMB levels, n being a natural number, and
    digital filtering said decimated digital signal a digital filter having a bandpass characteristics.

9. The method according to claim 8, wherein the analog filtering has a low-pass characteristic.

10. The method according to claim 8, wherein the sigma-delta modulator is implemented in wired-logic hardware.

11. The method according to claim 8, wherein the digital filter is implemented by a program-controlled microcontroller.

12. The method according to claim 8, wherein the CIC filter is designed to provide its output signal with a sampling rate which corresponds to 4 times the center frequency of the following digital filter.

13. The method according to claim 8, wherein the CIC filter has an array of decimators and downstream COMB levels in order to provide multiple filtered output signals with different characteristics from each other.

14. The method according to claim 8, wherein the sigma-delta modulator is implemented as a micro-electronically integrated circuit arrangement.

15. An arrangement comprising:
a knock sensor;
a signal processing device receiving and processing a signal from said knock sensor and comprising:
an analog filter,
a sigma-delta modulator designed for analog-digital conversion coupled to said analog filter,
a CIC filter coupled to said sigma-delta modulator and designed to decimate the sampling rate having n integrator levels and n+1 COMB levels, n being a natural number, and
a digital filter coupled to said CIC filter with bandpass characteristics; and
an evaluation device receiving an output signal from said signal processing device.

16. The arrangement according to claim 15, wherein the knock sensor is an accelerometer fastened to an engine block.

17. The arrangement according to claim 15, wherein the analog filter is designed as a first-order, passive RC-low-pass filter.

18. The arrangement according to claim 15, wherein the CIC filter comprises three integrator levels on an input side, a subsequent decimator, followed by three differentiation levels.

19. The arrangement according to claim 15, wherein the sigma-delta modulator is implemented in wired-logic hardware.

20. The arrangement according to claim 15, wherein the digital filter is implemented by a program-controlled microcontroller.

* * * * *